(12) United States Patent
Yin et al.

(10) Patent No.: US 11,842,911 B2
(45) Date of Patent: Dec. 12, 2023

(54) WAFER STRESS CONTROL USING BACKSIDE FILM DEPOSITION AND LASER ANNEAL

(71) Applicant: YANGTZE MEMORY TECHNOLOGIES CO., LTD., Wuhan (CN)

(72) Inventors: Pengan Yin, Wuhan (CN); Siping Hu, Wuhan (CN); Shu Wu, Wuhan (CN); Lina Miao, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 128 days.

(21) Appl. No.: 17/488,728

(22) Filed: Sep. 29, 2021

(65) Prior Publication Data
US 2023/0062866 A1 Mar. 2, 2023

Related U.S. Application Data

(63) Continuation of application No. PCT/CN2021/115218, filed on Aug. 30, 2021.

(51) Int. Cl.
*H01L 21/67* (2006.01)
*H10B 43/20* (2023.01)
*H01L 21/02* (2006.01)
*H01L 21/268* (2006.01)

(52) U.S. Cl.
CPC .. *H01L 21/67288* (2013.01); *H01L 21/02016* (2013.01); *H01L 21/02035* (2013.01); *H01L 21/268* (2013.01); *H10B 43/20* (2023.02)

(58) Field of Classification Search
CPC ......... H01L 21/67288; H01L 21/02016; H01L 21/02035; H01L 21/268; H01L 22/00; H01L 21/302; H01L 21/3247; H10B 43/20
See application file for complete search history.

(56) References Cited

U.S. PATENT DOCUMENTS

| | | | |
|---|---|---|---|
| 2005/0003633 A1* | 1/2005 | Mahle | H01L 21/268 |
| | | | 257/E21.599 |
| 2013/0161797 A1* | 6/2013 | Aida | H01L 29/205 |
| | | | 438/799 |
| 2017/0263466 A1 | 9/2017 | Ranish et al. | |

(Continued)

FOREIGN PATENT DOCUMENTS

| | | |
|---|---|---|
| CN | 108281369 A | 7/2018 |
| CN | 110620040 | * 12/2019 |
| CN | 110620040 A | 12/2019 |

(Continued)

OTHER PUBLICATIONS

Shi et al. (CN 110620040) machine translation (Year: 2019).*
Chu et al. (KR 2008/0059804) machine translation (Year: 2008).*

*Primary Examiner* — Yasser A Abdelaziez
(74) *Attorney, Agent, or Firm* — BAYES PLLC

(57) ABSTRACT

In certain aspects, a method for controlling wafer stress is disclosed. A semiconductor film is formed on a backside of a wafer. The wafer is deformed by stress associated with a front-side semiconductor structure on a front side of the wafer opposite to the backside of the wafer. A laser application region of the semiconductor film is determined. A laser anneal process is performed in the laser application region of the semiconductor film.

20 Claims, 9 Drawing Sheets

(56) References Cited

U.S. PATENT DOCUMENTS

2020/0251443 A1* 8/2020 Kanakamedala ....... H01L 25/18

FOREIGN PATENT DOCUMENTS

| CN | 112216609 A | 1/2021 |
| JP | 2004342753 A | 12/2004 |
| KR | 20080059804 | * 7/2008 |
| KR | 20080059804 A | 7/2008 |

* cited by examiner

WAFER STRESS CONTROL USING BACKSIDE FILM DEPOSITION AND LASER ANNEAL

CROSS-REFERENCE TO RELATED APPLICATIONS

This application is continuation of International Application No. PCT/CN2021/115218, filed on Aug. 30, 2021, entitled "WAFER STRESS CONTROL USING BACKSIDE FILM DEPOSITION AND LASER ANNEAL," which is hereby incorporated by reference in its entirety.

BACKGROUND

The present disclosure relates to wafer stress control in semiconductor device fabrication.

Wafer flatness has a very large influence on semiconductor device fabrication because of the impact it can have on the ability of photolithograph systems to effectively project device patterns. Severe changes in surface topography within the area of exposure, however, can alter the device feature patterns and, ultimately, lead to potential die yield loss. For accurate projection, it is thus important to expose a pattern of light on a wafer that is relatively flat or planar. Wafer flatness is also important for other fabrication processes. For example, during the bonding process, the flatness of each wafer to be bonded needs to be controlled within a reasonable deviation range to ensure direct contact of the two bonding surfaces.

SUMMARY

In one aspect, a method for controlling wafer flatness is disclosed. A semiconductor film is formed on a backside of a wafer. The wafer is deformed by stress associated with a front-side semiconductor structure on a front side of the wafer opposite to the backside of the wafer. A laser application region of the semiconductor film is determined. A laser anneal process is performed in the laser application region of the semiconductor film.

In another aspect, a method for forming a semiconductor structure is disclosed. A front-side semiconductor structure is formed on a front side of a wafer. A semiconductor film is deposited on a backside opposite to the front side of the wafer. A laser application region of the semiconductor film is determined. A laser anneal process is performed in the laser application region of the semiconductor film.

In still another aspect, a semiconductor structure includes a wafer, a front-side semiconductor structure, and a semiconductor film. The wafer has a front side and a backside opposite to the front side. The front-side semiconductor structure is formed on the front side of the wafer. The semiconductor film covers the backside of the wafer and includes at least one of amorphous silicon or polysilicon.

In yet another aspect, a semiconductor structure includes a semiconductor substrate, a semiconductor device, and a semiconductor film. The semiconductor substrate has a front side and a backside opposite to the front side. The semiconductor device is on the front side of the semiconductor substrate. The semiconductor film covers the backside of the semiconductor substrate and includes at least one of amorphous silicon or polysilicon.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
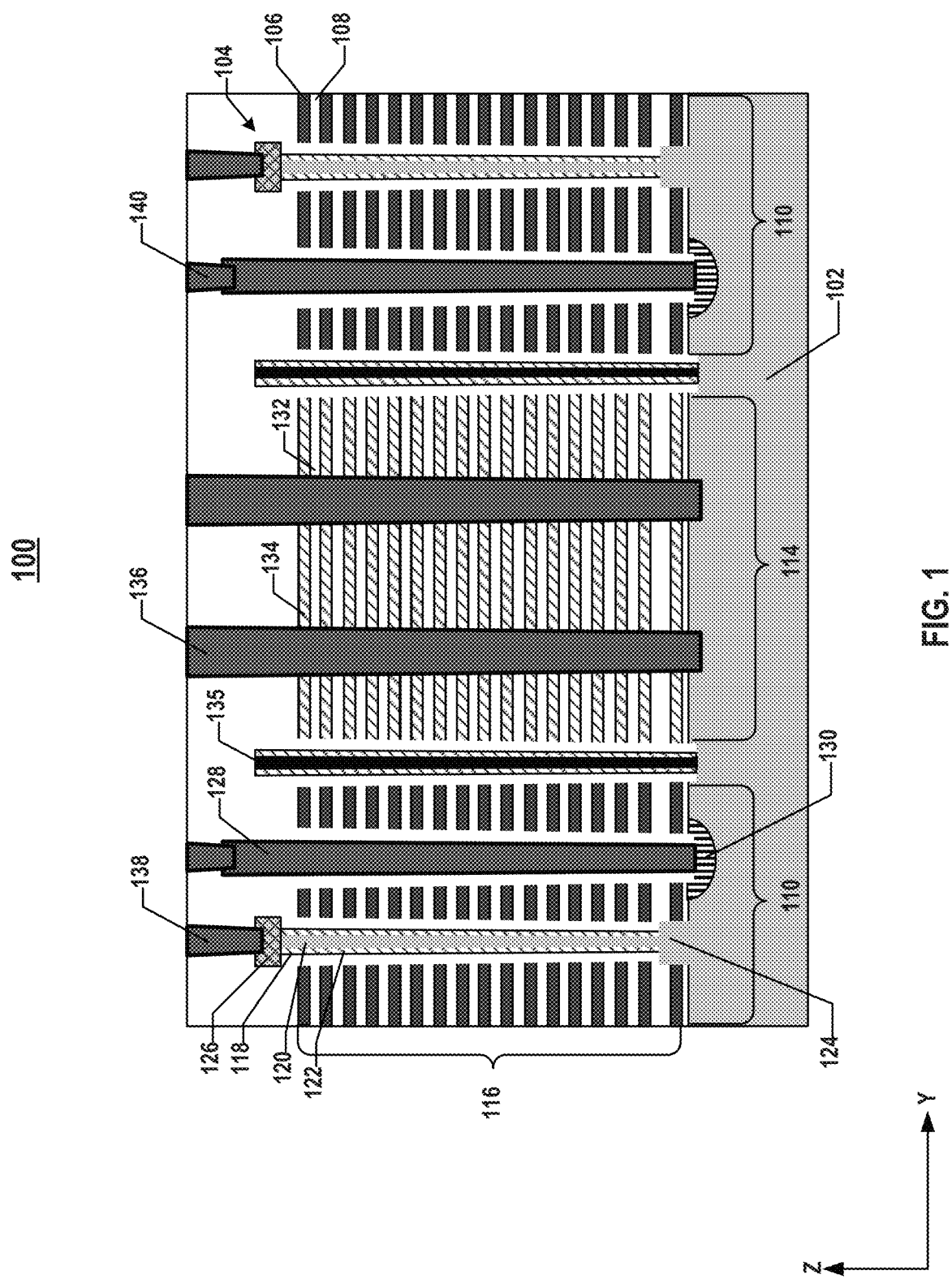
FIG. 1 illustrates a cross-sectional view of an exemplary semiconductor device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

Due to the influence of film deposition, heat treatment, or any other manufacturing processing, stress may be accumulated on a wafer during a fabrication process of a semiconductor structure. The stress may result in a shape variation on the wafer such that the wafer may be bent and/or expanded. In some cases, the shape variation on the wafer may not be uniformly distributed because layout designs of the semiconductor structure in different directions may be different. In some cases, one or more regions of the wafer may be severely deformed due to mismatched local stress distributed in the one or more regions of the wafer. For example, the stress distributed in the one or more regions of the wafer may fluctuate rapidly, such that the shape of the wafer in the one or more regions is varied irregularly. The shape variation of the wafer may have an impact on the fabrication process of the semiconductor structure and may lead to potential die yield loss. For example, it can be difficult to bond the wafer having the shape variation with another wafer during the bonding process. Potential die yield loss may be incurred by the shape variation of the wafer.

In some cases, backside deposition solution has been used to compensate for a shape variation of a wafer, e.g., wafer bow or wafer warp, caused by the stress built up on the front side of the wafer during semiconductor device fabrication. For example, bending stress (tension or compression) can be introduced on the front side of the wafer during semiconductor device fabrication. A material film can be uniformly deposited to cover the entire surface of the backside of the wafer in order to restore the curvature of the wafer caused by the bending stress on the opposite side of the wafer. However, certain fabrication stages for making some semiconductor devices (e.g., 3D memory devices) may introduce unbalanced variations of wafer flatness in different directions. In other words, the fabrication of some semiconductor structures may cause the curvature of the wafer to vary in different directions, which makes the backside deposition solution less effective. For example, unbalanced shape variations of the wafer in a first direction (e.g., an x-direction) and a second direction (e.g., a y-direction) or mismatched local stress distributed in a region of the wafer may make the backside deposition solution less effective.

To address one or more of the aforementioned issues, the present disclosure introduces a stress control solution in which a semiconductor film may be formed on a backside of a wafer, and a laser anneal process may be performed in a laser application region of the semiconductor film to control stress distributed on the wafer. By adjusting the laser application region of the semiconductor film and/or adjusting one or more laser control parameters (e.g., laser power or any other laser parameters), a distribution of stress on the wafer may be controlled to improve the flatness of the wafer.

In some implementations, for each wafer to be processed by the stress control solution disclosed herein, a shape variation of the wafer can be determined based on at least one of a design of a front-side semiconductor structure formed on the front side of the wafer or a fabrication stage of the front-side semiconductor structure. For example, a shape variation of the wafer can be determined based on the design of the front-side semiconductor structure, the fabrication stage of the front-side semiconductor structure, or a combination of the design and the fabrication stage of the front-side semiconductor structure. Alternatively or additionally, the shape variation of the wafer can be measured by a wafer measuring machine. A laser application region of the semiconductor film may be determined or adjusted based on the shape variation of the wafer. Then, a laser anneal process may be performed in the laser application region to control stress distributed on the wafer. In this case, different laser application regions may be customized for controlling stress on different wafers, and the stress control solution disclosed herein may be tailored wafer by wafer. As a result, the accuracy of the stress control solution can be improved.

In some implementations, empirical laser application data may be obtained based on at least one of the design of the front-side semiconductor structure or the fabrication stage of the front-side semiconductor structure. The laser application region of the semiconductor film may be determined based on the empirical laser application data. Specifically, for each wafer to be processed, no measurement needs to be performed on the wafer to determine a shape variation or a distribution of stress on the wafer. An empirical laser application region can be applied to perform a laser anneal process on the wafer. In this case, stress control can be performed on wafers in batch with improved efficiency (with no need to measure the shape variation of each wafer).

In some implementations, one or more laser control parameters (e.g., laser power or a laser application time) can be adjusted to control the amount of heat or energy produced by the laser anneal process. As a result, an appropriate area of amorphous silicon in the semiconductor film can be transformed into polysilicon by the heat or energy produced by the laser anneal process to control distribution of stress on the wafer, so that the flatness of the wafer can be improved.

FIG. 1 illustrates a cross-sectional view of an exemplary semiconductor device, according to some aspects of the present disclosure. For ease of description, the exemplary semiconductor device will be described as a 3D memory device 100 to illustrate various semiconductor structures formed on the front side of a wafer that can cause the shape of the wafer to vary in one or more directions in the wafer plane. However, it is understood that the semiconductor device is not limited to a 3D memory device and can include any suitable semiconductor device, such that the stress control solution disclosed herein can be applied to improve the flatness of the wafer as described below in detail. The semiconductor device can include any suitable logic devices, volatile memory devices (e.g., dynamic random-access memory (DRAM) and static random-access memory (SRAM)), and non-volatile memory devices (e.g., Flash memory) in a 2D, 2.5D, or 3D architecture. As used herein, a "wafer" may be a piece of a semiconductor material for semiconductor devices to build in and/or on it and that can undergo various fabrication processes before being separated into dies.

3D memory device 100 can be formed on the front side of the wafer and include a substrate 102 (e.g., part of the wafer), which can include silicon (e.g., single crystalline silicon), silicon germanium (SiGe), gallium arsenide (GaAs), germanium (Ge), silicon on insulator (SOI), germanium on insulator (GOI), or any other suitable materials.

3D memory device 100 can include memory array devices above substrate 102. It is noted that y and z axes are included in FIG. 1 to further illustrate the spatial relationship of the components in 3D memory device 100. Substrate 102 includes two lateral surfaces extending laterally in the x-y plane: a top surface on the front side of the wafer on which 3D memory device 100 can be formed, and a bottom surface on the backside opposite to the front side of the wafer. The x-axis (not shown) is perpendicular to both y and z axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the z-direction (the vertical direction perpendicular to the x-y plane) when the substrate is positioned in the lowest plane of the semiconductor device in the z-direction. The same notion for describing spatial relationships is applied throughout the present disclosure.

In some implementations, 3D memory device 100 may be a NAND Flash memory device in which memory cells are provided in the form of an array of NAND memory strings 104 each extending vertically above substrate 102. Each NAND memory string 104 can extend vertically through a plurality of pairs each including a conductor layer 106 and a dielectric layer 108 (referred to herein as "conductor/dielectric layer pairs"). The stacked conductor/dielectric layer pairs are also referred to herein as a "memory stack" 110. The number of the conductor/dielectric layer pairs in memory stack 110 can set the number of memory cells in 3D memory device 100. Conductor layers 106 and dielectric layers 108 in memory stack 110 can stack alternatingly in the vertical direction. At least on one side in the lateral direction, memory stack 110 can include a staircase structure (not shown).

As shown in FIG. 1, each NAND memory string 104 can include a channel structure 118 extending vertically through memory stack 110. Channel structure 118 can include a channel hole filled with semiconductor materials (e.g., as a semiconductor channel 120) and dielectric materials (e.g., as a memory film 122). In some implementations, semiconductor channel 120 includes silicon, such as amorphous silicon, polysilicon, or single crystalline silicon. In some implementations, memory film 122 can be a composite layer including a tunneling layer, a storage layer (also known as "charge trap/storage layer"), and a blocking layer. Each NAND memory string 104 can have a cylinder shape (e.g., a pillar shape). Semiconductor channel 120, the tunneling layer, the storage layer, and the blocking layer are arranged along a direction from the center toward the outer surface of the pillar in this order, according to some aspects.

In some implementations, NAND memory strings 104 may include a plurality of control gates (each being part of a word line) for NAND memory strings 104. Conductor layer 106 in memory stack 110 can function as a control gate for memory cells of NAND memory string 104. Conductor layer 106 can include multiple control gates for multiple NAND memory strings 104 and can extend laterally as a word line ending in the staircase structure. In some implementations, a word line extends in the x-direction (not shown) perpendicular to both the y-direction and the z-direction, and a bit line extends in the y-direction in FIG. 1.

In some implementations, NAND memory string 104 includes an epitaxial plug 124 and an etch stop plug 126 at a respective end in the vertical direction. Each of epitaxial plug 124 and etch stop plug 126 can be in contact with a respective end of channel structure 118. Epitaxial plug 124 can include a semiconductor material, such as silicon, that is epitaxially grown from substrate 102. Epitaxial plug 124 can function as the channel controlled by a source select gate of NAND memory string 104. Etch stop plug 126 can be at the upper end of NAND memory string 104 and in contact with channel structure 118. As used herein, the "upper end" of a component (e.g., NAND memory string 104) may be the end farther away from substrate 102 in the z-direction, and the "lower end" of the component (e.g., NAND memory string 104) may be the end closer to substrate 102 in the z-direction when substrate 102 is positioned in the lowest plane of 3D memory device 100.

In some implementations, 3D memory device 100 further includes slit structures 128. Each slit structure 128 can extend vertically through memory stack 110. Slit structure 128 can also extend laterally to separate memory stack 110 into multiple blocks. Slit structure 128 can include a slit (a trench) filled with conductive materials. Slit structure 128 can further include a dielectric layer with any suitable dielectric materials between the filled conductive materials and memory stack 110 to electrically insulate the filled conductive materials from surrounding conductor layers 106 in memory stack 110. As a result, slit structures 128 can separate 3D memory device 100 into multiple memory blocks and/or memory fingers.

In some implementations, slit structure 128 functions as the source contact for NAND memory strings 104 in the same memory block or the same memory finger that share the same array common source. Slit structure 128 can thus be referred to as a "common source contact" of multiple NAND memory strings 104. In some implementations, substrate 102 includes a doped region 130, and the lower end of slit structure 128 is in contact with doped region 130 of substrate 102. Slit structure 128 thus can electrically connect to NAND memory strings 104 by doped region 130. In some implementations, slit structure 128 also extends laterally in the x-direction (not shown) perpendicular to both the y-direction and z-direction.

As shown in FIG. 1, memory stack 110 can be a portion of an alternating layer stack 116, which can also include a dielectric stack 114 on substrate 102. Dielectric stack 114 can include a plurality of dielectric layer pairs, for example, an alternating stack of a first dielectric layer 132 and a second dielectric layer 134 that is different from first dielectric layer 132. First dielectric layers 132 in dielectric stack 114 can be the same as dielectric layers 108 in memory stack 110. In some implementations, the number of dielectric layer pairs in dielectric stack 114 is the same as the number of conductor/dielectric layer pairs in memory stack 110.

In some implementations, 3D memory device 100 includes a barrier structure 135 extending vertically through alternating layer stack 116. Barrier structure 135 can laterally separate alternating layer stack 116 into memory stack 110 and dielectric stack 114. That is, barrier structure 135 can become the boundary between memory stack 110 and dielectric stack 114. Dielectric stack 114 can be enclosed laterally by at least barrier structure 135. In some implementations, barrier structure 135 is in a closed shape (e.g., a rectangle, a square, a circle, etc.) in the plan view to completely enclose dielectric stack 114.

As shown in FIG. 1, 3D memory device 100 further includes through array contacts (TACs) 136 each extending vertically through dielectric stack 114. TACs 136 can be formed only inside the area enclosed laterally by at least barrier structure 135, which includes a plurality of dielectric layer pairs. That is, TACs 136 can extend vertically through dielectric layers (e.g., first dielectric layers 132 and second dielectric layers 134), but not through any conductor layers (e.g., conductor layers 106). Each TAC 136 can extend through the entire thickness of dielectric stack 114. In some implementations, TAC 136 further extends through at least part of substrate 102. TACs 136 can carry electrical signals from and/or to 3D memory device 100, such as part of the power bus, with shortened interconnect routing. In some implementations, TACs 136 can provide electrical connections between 3D memory device 100 and the peripheral device (e.g., on a complementary metal-oxide-semiconductor (CMOS) chip; not shown) and/or between back-end-of-line (BEOL) interconnects (not shown) and the peripheral device. TACs 136 can also provide mechanical support to alternating layer stack 116. Each TAC 136 can include a vertical opening through dielectric stack 114 and that is filled with conductive materials.

In some implementations, 3D memory device 100 includes a plurality of local contacts in contact with the various memory array structures disclosed herein, such as NAND memory strings 104 and slit structures 128. The contacts are referred to herein as "local contacts" as they are in contact with the memory array structures directly. As shown in FIG. 1, local contacts can include NAND memory string contacts 138 and slit structure contacts 140. TACs 136 can also be considered as local contacts in the present disclosure. As used herein, the term "contact" can broadly include any suitable types of interconnects, including vertical interconnect accesses (e.g., vias) and lateral lines (e.g., interconnect lines). Each local contact can include an opening (e.g., a via hole or a trench) filled with conductive materials.

A variety of semiconductor structures of a 3D memory device are described above with reference to FIG. 1, including NAND memory strings 104, slit structures 128, TACs 136, barrier structures 135, local contacts 138 and 140, and memory stack 110. Different semiconductor structures can have different designs, such as layouts, thicknesses, and materials. In one example, NAND memory strings 104 are arranged in a lattice layout, and each has a circular shape in the plan view and extends vertically through the memory stack. In another example, slit structures 128 are arranged in a parallel strip layout, and each extends laterally in the x-direction (e.g., the word line direction) and vertically in the z-direction through the memory stack. In still another example, memory stack 110 can be a stack of plates extending in both the z-direction and the x-y plane. The non-uniform nature of the properties (e.g., layout, thickness, and material) associated with different types of semiconductor structures can introduce different levels of mechanical stress in different directions in the wafer plane during the fabrication of the 3D memory device, thereby causing the difference in the shape variation of the wafer in different directions.

Moreover, the wafer carrying the semiconductor structures of the 3D memory device undergoes a series of fabrication processes to make the 3D memory device. At different fabrication stages, the properties (e.g., layout, thickness, and material) associated with each type of semiconductor structures may vary as well. Thus, the level and/or direction of the mechanical stress introduced by the same type of semiconductor structures can still vary at different fabrication stages. In one example, the mechanical stress caused by slit structures 128 can change before and after depositing the filling materials into the trenches. In another example, the mechanical stress caused by memory stack 110 can change before, during, and after the gate replacement process, which removes dielectric layers 134 and fills the resulting recesses with conductor layers 106. As a result, the specific fabrication stages may need to be taken into consideration for precise control of wafer stress, according to some aspects.

Figure 2A:
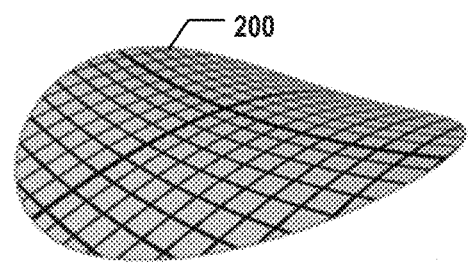
FIGS. 2A-2C illustrate various exemplary wafer shape variations, according to some aspects of the present disclosure.
Figure 2B:
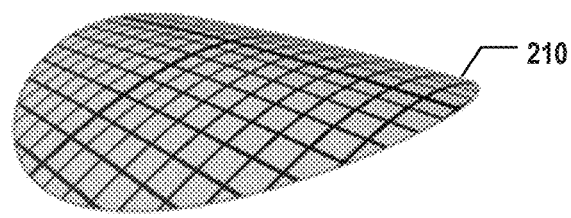
Figure 2C:
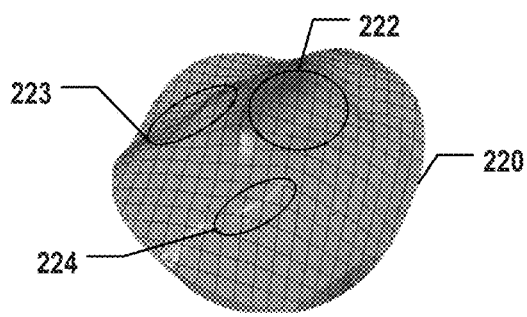

FIGS. 2A-2C illustrate various exemplary wafer shape variations, according to some aspects of the present disclosure. Referring to FIG. 2A, a wafer 200 may be bent downwards smoothly in a first direction and bent upwards smoothly in a second direction. The first direction may intersect with the second direction (e.g., the first direction may be perpendicular to the second direction). For example, wafer 200 may have a saddle-like shape. Referring to FIG. 2B, a wafer 210 may be bent downwards smoothly in the first direction. Wafer 210 may not be bent in the second direction. For example, wafer 210 may have a shape that rolls up in the first direction. Referring to FIG. 2C, regions 222, 223, and 224 of a wafer 220 may have mismatched local stress that fluctuates rapidly, leading to the shape of wafer 220 to be varied irregularly in regions 222, 223, and 224.

Consistent with certain aspects of the disclosure, a region of the wafer having mismatched local stress distribution may be referred to a region of the wafer having mismatched stress that fluctuates rapidly or sharply (e.g., a fluctuation speed of the stress being greater than a fluctuation threshold), leading to the shape of the wafer in the region to be varied irregularly or sharply.

Figure 3:
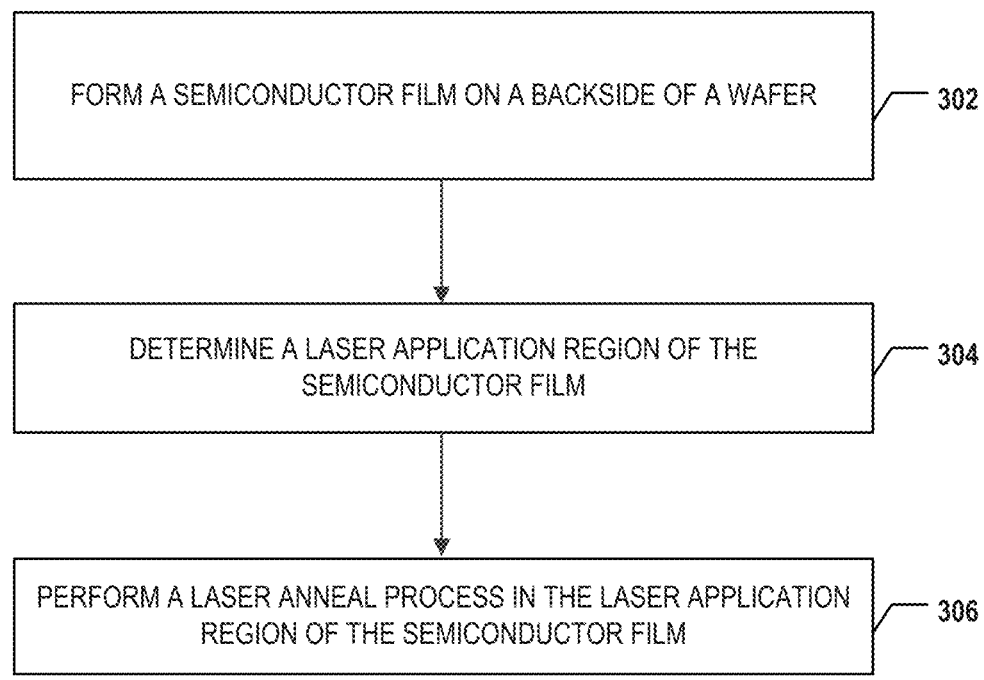
FIG. 3 is a flowchart of an exemplary method for controlling wafer stress, according to some aspects of the present disclosure.

FIG. 3 is a flowchart of an exemplary method 300 for controlling wafer stress, according to some aspects of the present disclosure. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a semiconductor film is formed on a backside of a wafer. In some implementations, the semiconductor film can be deposited uniformly on the backside of the wafer. The material of the semiconductor film may include amorphous silicon.

In some implementations, the wafer may be deformed by stress associated with a fabrication stage of a front-side semiconductor structure on a front side of the wafer opposite to the backside of the wafer. The front-side semiconductor structure may be any semiconductor structure formed on the front side of the wafer. For example, the front-side semiconductor structure may include a plurality of semiconductor devices formed on the front side of the wafer. In another example, the front-side semiconductor structure may include a semiconductor structure formed in the front side of the wafer at a particular fabrication stage of the plurality of semiconductor devices. In some implementations, the wafer can include substrate 102 in FIG. 1 on which 3D memory device 100 is formed (on the front side).

In some implementations, a shape variation of the wafer incurred by the stress associated with the fabrication stage of the front-side semiconductor structure can be determined. For example, the shape variation of the wafer can be associated with one of a plurality of fabrication stages of a plurality of semiconductor devices on a front side of the wafer. The plurality of fabrication stages can include, but not limited to, deposition of the dielectric stack (e.g., 114 in FIG. 1), etching of channel holes of NAND memory strings (e.g., 104 in FIG. 1), etching of trenches of barrier structures (e.g., 135 in FIG. 1), etching of trenches of slit structures (e.g., 128 in FIG. 1), deposition of filling materials of NAND memory strings (e.g., 104 in FIG. 1), deposition of filling materials of barrier structures (e.g., 135 in FIG. 1), gate replacement for memory stack (e.g., 110 in FIG. 1), deposition of filling materials of slit structures (e.g., 128 in FIG. 1), etching of local contact holes (e.g., TACs 136 in FIG. 1), and deposition of filling materials of local contacts (e.g., TACs 136 in FIG. 1).

In some implementations, the shape variation of the wafer may be represented by at least one of a wafer bow (or a wafer warp) in a first direction, a wafer bow (or a wafer warp) in a second direction, or a wafer bow difference (or a wafer warp difference) between the first direction and the second direction. "Wafer bow" may be the deviation of the center point of the median surface of a free, un-clamped wafer from the median surface to the reference plane, which is defined by three corners of an equilateral triangle, according to the American Standard Test Method (ASTM) F534 standard. "Wafer warp" may be the difference between the maximum and the minimum distances of the median surface of a free, un-clamped wafer from the reference plane according to the ASTM F657 and ASTM F1390 standards. The first direction can be perpendicular to the second direction. For example, the first and second directions may be a word line direction and a bit line direction, respectively, or can be the x-direction and y-direction, respectively, as described above with reference to FIG. 1.

In some implementations, the shape variation of the wafer at a particular point of the wafer can be determined as a distance between the point of the wafer and the reference plane. Ideally, if the wafer is a round and flat disk of uniform thickness, a distance between each point of the wafer and the reference plane may be zero. However, since the wafer may be deformed by stress associated with a fabrication stage of the front-side semiconductor structure, at least a portion of the wafer may have a non-zero distance to the reference plane.

Figure 4:
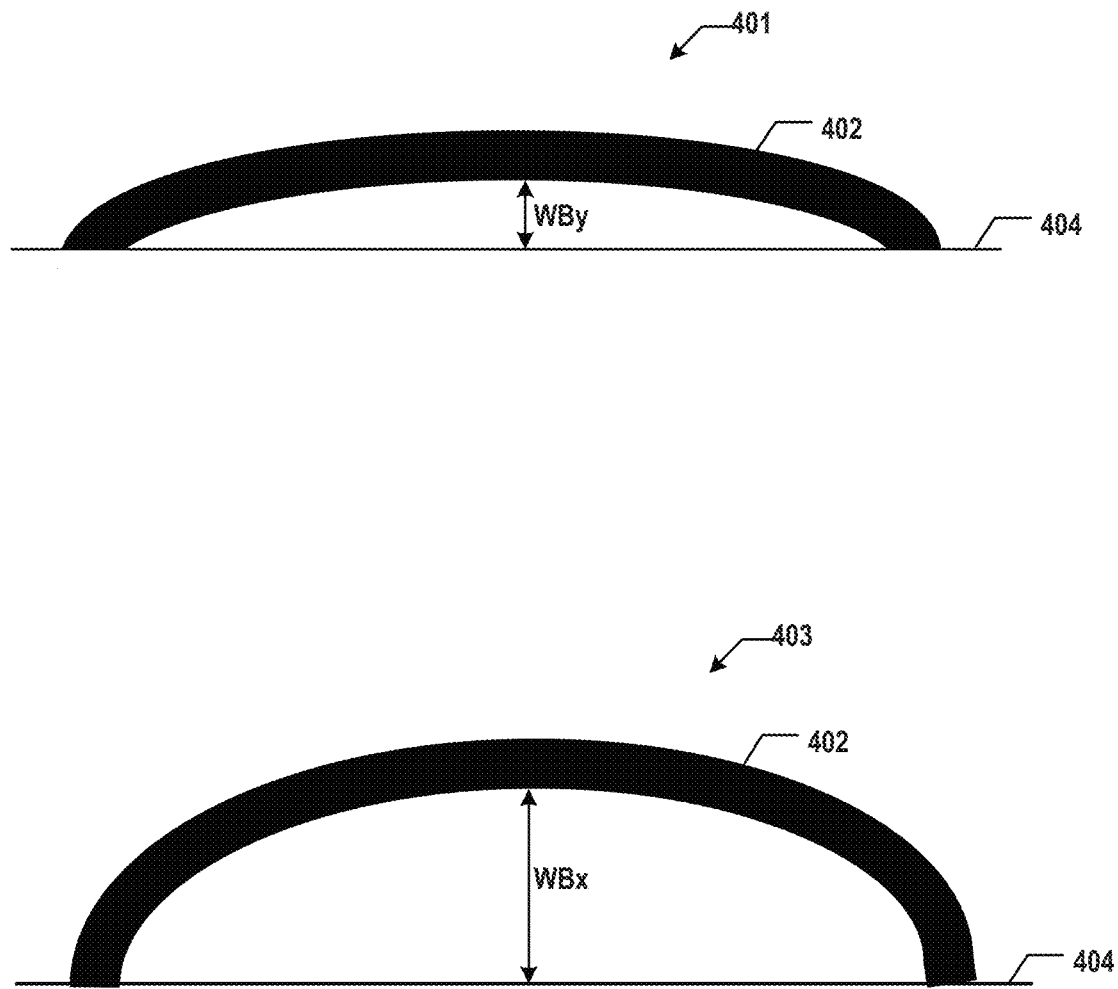
FIG. 4 illustrates exemplary measurement results of wafer bow, according to some aspects of the present disclosure.

In some implementations, the shape variation of the wafer may be measured or determined by a wafer measuring machine such as a wafer bow measuring machine. For example, for each point in the wafer, the wafer measuring machine may determine a distance between the point of the wafer and the reference plane. In another example, FIG. 4 illustrates exemplary measurement results 401 and 403 of wafer bow, according to some aspects of the present disclosure. For example, measurement result 401 indicates wafer bow WBy in the y-direction after the fabrication stage of etching slit structures (e.g., 128 in FIG. 1), and measurement result 403 indicates wafer bow WBx in the x-direction after the fabrication stage of etching the slit structures. Wafer bow WBy and wafer bow WBx can be real data measured from one or more testing wafers. Each of wafer bow WBy and wafer bow WBx can be measured as the deviation of the center point of the median surface of a free, un-clamped wafer 402 from the median surface to a reference plane 404, which is defined by three corners of an equilateral triangle according to the ASTM F534 standard. As shown in measurement results 401 and 403, wafer bow WBx in the x-direction is greater than wafer bow WBy in the y-direction. In some implementations, the wafer bow difference is calculated by the equation of (WBx−WBy) or the equation of (WBx−WBy)/WBx.

In some implementations, the shape variation of the wafer may be determined based on a design of the front-side semiconductor device (e.g., a plurality of semiconductor devices) and a fabrication stage of the plurality of semiconductor devices. The design of the semiconductor devices can include the type of the semiconductor devices (e.g., logic devices, volatile memory devices, or non-volatile memory devices in 2D, 2.5D, or 3D architecture). The design of the semiconductor devices can further include the design of each type of semiconductor structures of a semiconductor device, such as the layout, thickness, and material. The fabrication stages of the semiconductor devices can be different for different types of semiconductor devices. For a 3D memory device (e.g., described above with reference to FIG. 1), the fabrication stages include, for example, deposition of the dielectric stack, etching of channel holes of NAND memory strings, etching of trenches of barrier structures, etching of trenches of slit structures, deposition of filling materials of NAND memory strings, deposition of filling materials of barrier structures, gate replacement for memory stack, deposition of filling materials of slit structures, etching of local contact holes, and deposition of filling materials of local contacts.

Figure 6A:
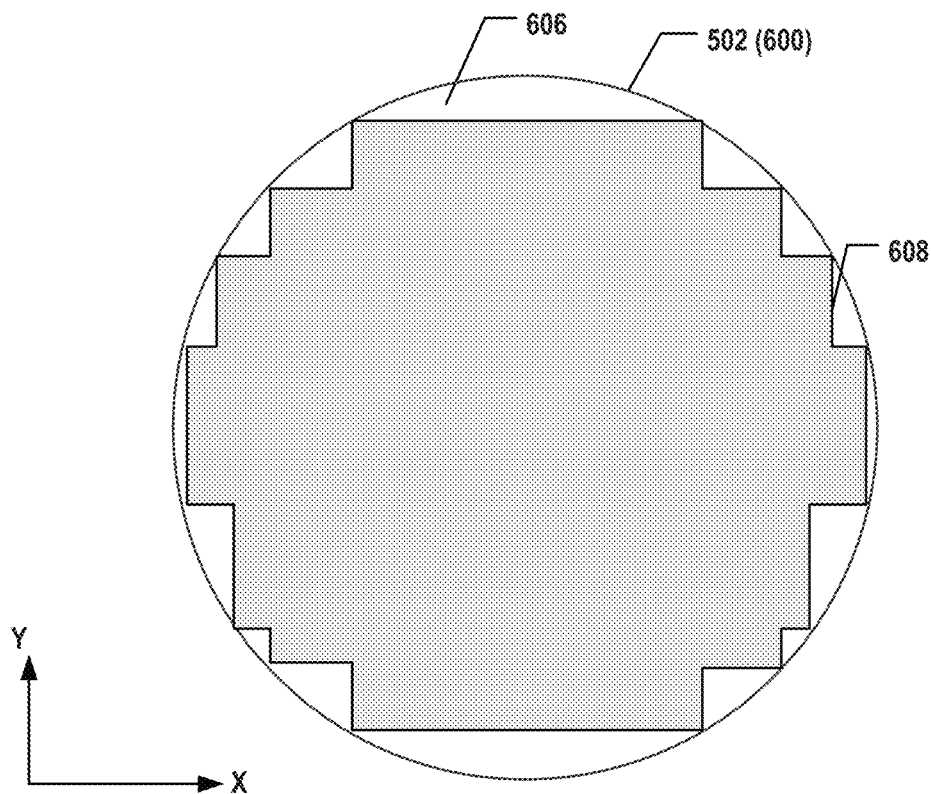
FIG. 6A illustrates a backside of the wafer of FIG. 5 deposited with a semiconductor film having an exemplary laser application region, according to some aspects of the present disclosure.
Figure 6B:
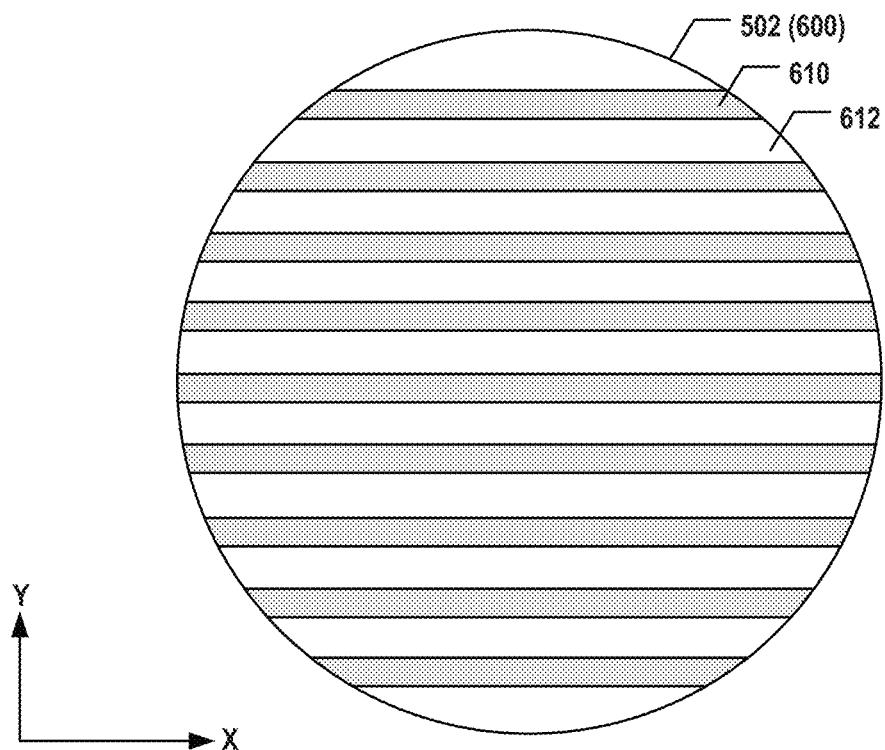
FIG. 6B illustrates the backside of the wafer of FIG. 5 deposited with a semiconductor film having another exemplary laser application region, according to some aspects of the present disclosure.
Figure 6C:
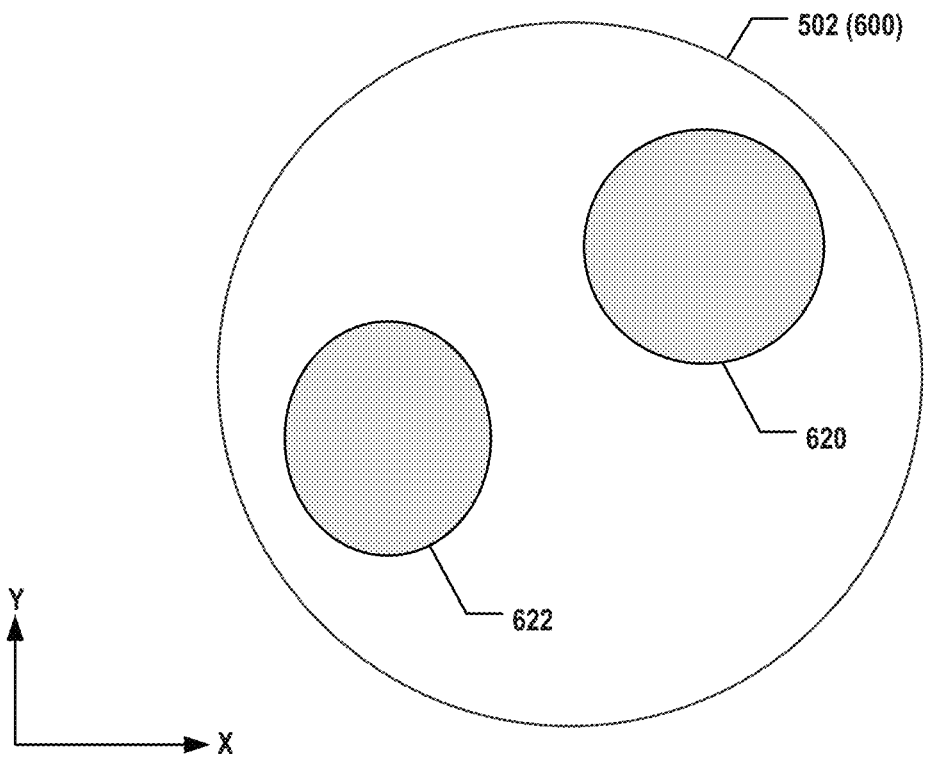
FIG. 6C illustrates the backside of the wafer of FIG. 5 deposited with a semiconductor film having still another exemplary laser application region, according to some aspects of the present disclosure.

Method 300 proceeds to operation 304, as illustrated in FIG. 3, in which a laser application region of the semiconductor film is determined. A laser application region can be a region (or a portion) of the semiconductor film in which a laser anneal process can be performed. For example, the laser application region can include part of or the entirety of the semiconductor film where a laser anneal process can be performed. In some implementations, the laser application region may include a plurality of application zones in the semiconductor film (e.g., as shown in FIG. 6B below). In some implementations, the laser application region may include a region of the semiconductor film that corresponds to a region of the wafer having a mismatched local stress distribution (e.g., as shown in FIG. 6C below).

Consistent with certain aspects of the disclosure, if a region (or portion) of the semiconductor film corresponds to a region (or portion) of the wafer, the region (or portion) of the semiconductor film may overlap with the region (or portion) of the wafer in the vertical direction. For example, the region (or portion) of the semiconductor film and the region (or portion) of the wafer may partially or completely overlap with each other in the vertical direction. The vertical direction may be perpendicular to the wafer plane.

In some implementations, the laser application region of the semiconductor film may be determined based on the shape variation of the wafer. For example, one or more portions of the wafer can be determined based on the shape variation of the wafer, such that each of the one or more portions of the wafer may include points of the wafer having non-zero distances to the reference plane. Then, the laser application region of the semiconductor film may be determined to include one or more portions of the semiconductor film that correspond to the one or more portions of the wafer, respectively.

In another example, assuming that the shape variation of the wafer indicates that both the wafer bow in the first direction and the wafer bow in the second direction are equal to or greater than a bow threshold, which indicates that stress control may need to be performed in a substantial portion of the semiconductor film (e.g., 80%, 90%, or 100% of the semiconductor film). The bow threshold may be predetermined based on historical processing of the stress control on different wafers, or may be configured by a user. In this case, the laser application region may include a substantial portion of the semiconductor film (e.g., 80%, 90%, or 100% of the semiconductor film), as shown in FIG. 6A below by way of examples. The wafer may have, for example, a bowl-like shape or a saddle-like shape.

In still another example, assuming that the shape variation of the wafer indicates that the wafer bow in the first direction is equal to or greater than the bow threshold while the wafer bow in the second direction is smaller than the bow threshold, which indicates that stress control may need to be performed along the first direction. In this case, the laser application region may include a plurality of application zones each extending along the first direction (e.g., as shown in FIG. 6B below). The wafer may have, for example, a shape rolling up in the first direction. Each application zone may include a portion of the semiconductor film extending along the first direction.

In yet another example, a distribution of stress on the wafer can be determined based on the shape variation of wafer. Alternatively, the distribution of stress on the wafer may be determined using a wafer measuring machine. If the distribution of stress indicates that one or more regions of the wafer may have mismatched local stress distribution, the laser application region may include one or more portions of the semiconductor film that correspond to the one or more regions of the wafer, respectively (e.g., as shown in FIG. 6C below).

In some implementations, for each available design and fabrication stage of the front-side semiconductor structure, one or more historical laser application regions for the available design and fabrication stage of the front-side semiconductor structure can be obtained from historical processing of stress control on one or more wafers. Then, an empirical laser application region for the available design and fabrication stage of the front-side semiconductor structure can be determined as a combination of the one or more historical laser application regions. For example, a first historical laser application region can be obtained from the historical processing of stress control on a first wafer associated with the available design and fabrication stage of the front-side semiconductor structure. A second historical laser application region can be obtained from the historical processing of stress control on a second wafer associated with the available design and fabrication stage of the front-side semiconductor structure. An empirical laser application region for the design and fabrication stage of the front-side semiconductor structure can be determined as a union (or an overlapping portion) of the first and second historical laser application regions for the available design and fabrication stage of the front-side semiconductor structure. By performing similar operations, a plurality of empirical laser application regions for a plurality of designs and fabrication stages of the front-side semiconductor structure can be determined based on historical processing of stress control on wafers associated with the plurality of designs and fabrication stages of the front-side semiconductor structure, respectively.

In some implementations, empirical laser application data can be obtained based on at least one of a design of the front-side semiconductor structure or a fabrication stage of the front-side semiconductor structure. The empirical laser application data may describe an empirical laser application region for the design and the fabrication stage of the front-side semiconductor structure. The laser application region of the semiconductor film may be determined based on the empirical laser application data. For example, the laser application region of the semiconductor film can be determined to be the empirical laser application region for the design and the fabrication stage of the front-side semiconductor structure. That is, for different wafers associated with the same design and fabrication stage of the front-side semiconductor structure, an empirical laser application region for the design and fabrication stage of the front-side semiconductor structure can be used as a laser application region for performing the stress control on the different wafers.

Method 300 proceeds to operation 306, as illustrated in FIG. 3, in which a laser anneal process is performed in the laser application region of the semiconductor film. In some implementations, the semiconductor film may include amorphous silicon. Through an application of the laser anneal process in the laser application region of the semiconductor film, amorphous silicon in the laser application region may be transformed into polysilicon. For example, amorphous silicon in the laser application region may be transformed into polysilicon under an action of the heat or energy produced by the laser anneal process. A remaining portion of the semiconductor film may still have amorphous silicon, since no laser anneal is performed in the remaining portion of the semiconductor film. Polysilicon in the laser application region and amorphous silicon in the remaining portion of the semiconductor film may cooperate with each other to control the distribution of stress on the wafer and to improve the flatness of the wafer. In some implementations, the amorphous silicon and the polysilicon are non-doped silicon.

In some implementations, one or more laser control parameters may be determined for performing the laser anneal process in the laser application region. That is, the laser anneal process may be performed in the laser application region based on the one or more laser control parameters. The one or more laser control parameters may include, for example, at least one of a laser power, a laser application time, a laser size, or a laser output form. For example, the one or more laser control parameters may include, for example, a laser power, a laser application time, a laser size, a laser output form, or any combination thereof. The laser output form may indicate that an output laser in the laser anneal process may be a continuous laser signal or a pulse-like laser signal. For a pulse-like laser signal, a duty cycle of the pulse-like laser signal may also be determined.

For example, the laser power may be determined based on a shape variation of the wafer (or, a distribution of stress on the wafer). A greater shape variation of the wafer (or, a higher stress on the wafer) may lead to a higher laser power to be applied, so that more heat or energy can be generated by the laser anneal process to transform the amorphous silicon in the laser application region into polysilicon. For example, assuming that the laser application region includes a first sub-region and a second sub-region. The laser power for the first sub-region may be higher than the laser power for the second sub-region if the first sub-region has a greater shape variation than the second sub-region (or, the stress in the first sub-region is higher than that in the second sub-region).

In another example, the laser application time can be determined based on the shape variation of the wafer (or, the distribution of stress on the wafer). A greater shape variation of the wafer (or, a higher stress on the wafer) may lead to a longer laser application time, so that more heat or energy can be generated by the laser anneal process to transform the amorphous silicon in the laser application region into polysilicon.

In some implementations, the laser anneal process may be performed in one or more directions (e.g., a first direction such as the x-direction, a second direction such as the y-direction). For each direction, a set of trajectories each extending along the direction can be determined in the laser application region, so that the output laser from the laser anneal process may move along the set of trajectories on the semiconductor film, respectively. Exemplary trajectories are illustrated below with reference to FIGS. 6D-6F. For each trajectory, the laser power along the trajectory may be the same. Alternatively, the laser power along the trajectory may be varied as the output laser moves along the trajectory. For example, a first point and a second point in the trajectory may correspond to a first wafer point and a second wafer point on the wafer, respectively (e.g., in the vertical direction, the first point and the second point of the semiconductor film may overlap with the first wafer point and the second wafer point of the wafer, respectively). The laser power applied at the first point of the trajectory may be higher than the laser power applied at the second point of the trajectory if the first wafer point on the wafer has a higher distance to the reference plane than the second wafer point.

A density of the trajectories (or, a number of trajectories) in the laser application region can be determined based on one or more laser control parameters. For example, if the laser anneal process has a higher laser power, a longer laser application time, or a larger laser size, less trajectories can be included in the laser application region, as long as sufficient heat or energy can be produced by the laser anneal process to transform the amorphous silicon in the laser application region into polysilicon.

In some examples, the laser application region may include a plurality of application zones each extending along the first direction. For each application zone, one or more trajectories each extending in the first direction may be determined, so that the laser anneal process may be performed along the one or more trajectories in the application zone, respectively, to reduce a mismatch between a wafer bow in the first direction and a wafer bow in the second direction. For example, the wafer may have a shape that rolls up in the first direction. The wafer bow in the first direction may be equal to or greater than the bow threshold, and the wafer bow in the second direction may be smaller than the bow threshold. The laser anneal process may be performed along each trajectory extending in the first direction (within the plurality of application zones) based on the one or more laser control parameters.

In some examples, the laser anneal process may be performed along a first set of trajectories in the first direction and a second set of trajectories in the second direction to adjust a wafer bow in the first direction and a wafer bow in the second direction. For example, the wafer may have a bowl-like shape or a saddle-like shape. Both the wafer bow in the first direction and the wafer bow in the second direction are equal to or greater than the bow threshold. The laser anneal process may be performed along each trajectory in the first direction and each trajectory in the second direction based on the one or more laser control parameters, respectively.

In some examples, the laser application region may include one or more portions of the semiconductor film that correspond to one or more regions of the wafer having mismatched local stress distribution, respectively. For each portion of the semiconductor film, the laser anneal process may be performed along one or more trajectories within the portion of the semiconductor film based on the one or more laser control parameters.

Figure 5:
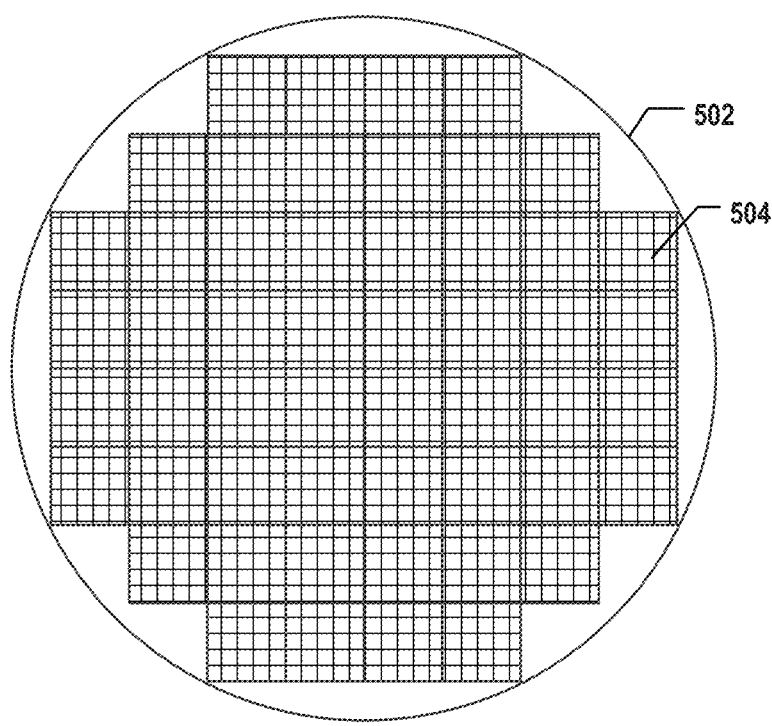
FIG. 5 illustrates a front side of an exemplary wafer having a front-side semiconductor structure, according to some aspects of the present disclosure.

FIG. 5 illustrates a front side of an exemplary wafer 502 having semiconductor devices, according to some aspects of the present disclosure. A plurality of semiconductor structures 504 can be arranged on the front side of wafer 502, and one or more semiconductor devices (e.g., a 3D memory device) can be formed on each semiconductor structure 504. For example, each semiconductor structure 504 may be a die formed on the front side of wafer 502.

FIG. 6A illustrates a backside of wafer 502 deposited with a semiconductor film 600 having an exemplary laser application region, according to some aspects of the present disclosure. Wafer 502 and semiconductor film 600 may overlap with each other when viewing from the vertical direction. Semiconductor film 600 may include amorphous silicon. Semiconductor film 600 may include a laser application region 608 and a remaining portion 606. A laser anneal process may be performed in laser application region 608 to transform amorphous silicon in laser application region 608 into polysilicon. Since no laser anneal process is performed in remaining portion 606, remaining portion 606 may include amorphous silicon.

FIG. 6B illustrates the backside of wafer 502 deposited with semiconductor film 600 having another exemplary laser application region, according to some aspects of the present disclosure. Wafer 502 and semiconductor film 600 may overlap with each other when viewing from the vertical direction. The laser application region in FIG. 6B may include a plurality of application zones 610 each extending along a first direction (e.g., the x-direction). Semiconductor film 600 may also include a plurality of non-application zones 612 that are located alternatingly with the plurality of application zones 610. A laser anneal process may be performed in each application zone 610 to transform amorphous silicon in application zone 610 into polysilicon. Since no laser anneal process is performed in the plurality of non-application zones 612, the plurality of non-application zones 612 may include amorphous silicon.

FIG. 6C illustrates the backside of wafer 502 deposited with semiconductor film 600 having still another exemplary laser application region, according to some aspects of the present disclosure. Wafer 502 and semiconductor film 600 may overlap with each other when viewing from the vertical direction. The laser application region in FIG. 6C may include sub-regions 620 and 622 that correspond to regions of wafer 502 having a mismatched local stress distribution, respectively. A laser anneal process may be performed in sub-regions 620 and 622 to transform amorphous silicon in sub-regions 620 and 622 into polysilicon. Since no laser anneal process is performed in a remaining portion of the semiconductor film, the remaining portion of the semiconductor film may include amorphous silicon.

Figure 6D:
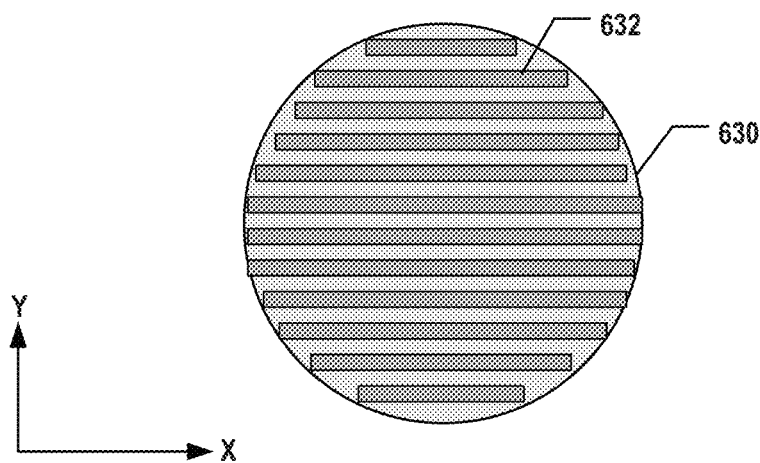
FIGS. 6D-6F illustrate exemplary trajectories for performing a laser anneal process in a laser application region, according to some aspects of the present disclosure.
Figure 6E:
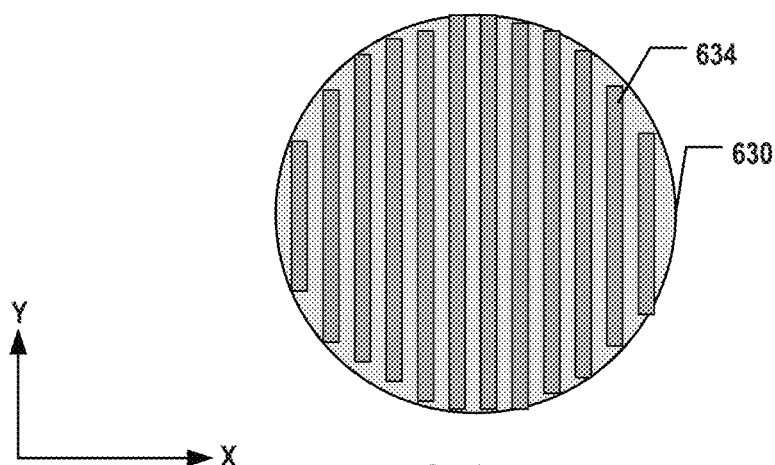
Figure 6F:
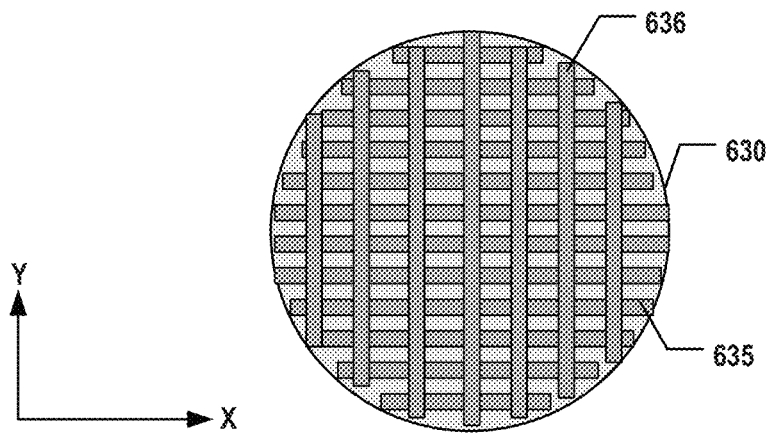

FIGS. 6D-6F illustrate exemplary trajectories for performing a laser anneal process in a laser application region 630, according to some aspects of the present disclosure. In FIGS. 6D-6F, laser application region 630 is illustrated to have a circular shape by way of examples. It is understood that laser application region 630 may have any other suitable shape as needed in practice. Referring to FIG. 6D, laser application region 630 may include a set of trajectories 632 extending along the x-direction. A laser anneal process may be performed along the set of trajectories 632, so that an output laser may move along the set of trajectories 632 in the x-direction, respectively. Referring to FIG. 6E, laser application region 630 may include a set of trajectories 634 each extending along the y-direction. A laser anneal process may be performed along the set of trajectories 634, so that an output laser may move along the set of trajectories 634 in the y-direction, respectively. Referring to FIG. 6F, laser application region 630 may include a first set of trajectories 635 each extending along the x-direction and a second set of trajectories 636 each extending along the y-direction. A laser anneal process may be performed along the first set of trajectories 635 and the second set of trajectories 636, so that an output laser may move along the first set of trajectories 635 in the x-direction and the second set of trajectories 636 in the y-direction, respectively.

Figure 7A:
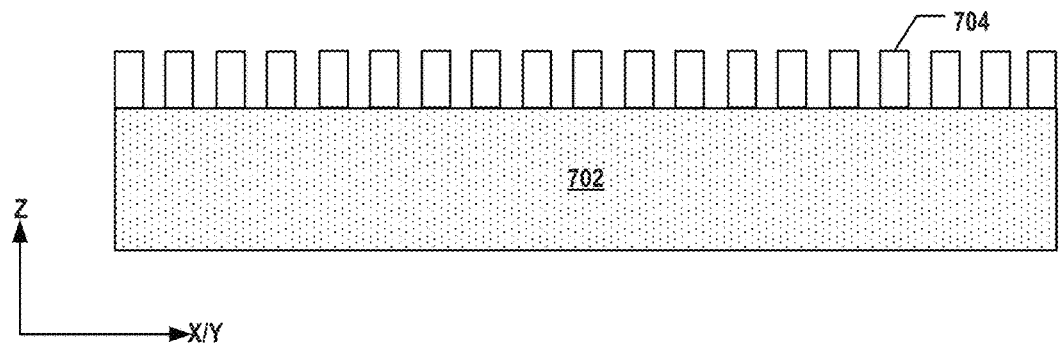
FIGS. 7A-7C illustrate an exemplary fabrication process for forming a semiconductor structure, according to some aspects of the present disclosure.
Figure 7B:
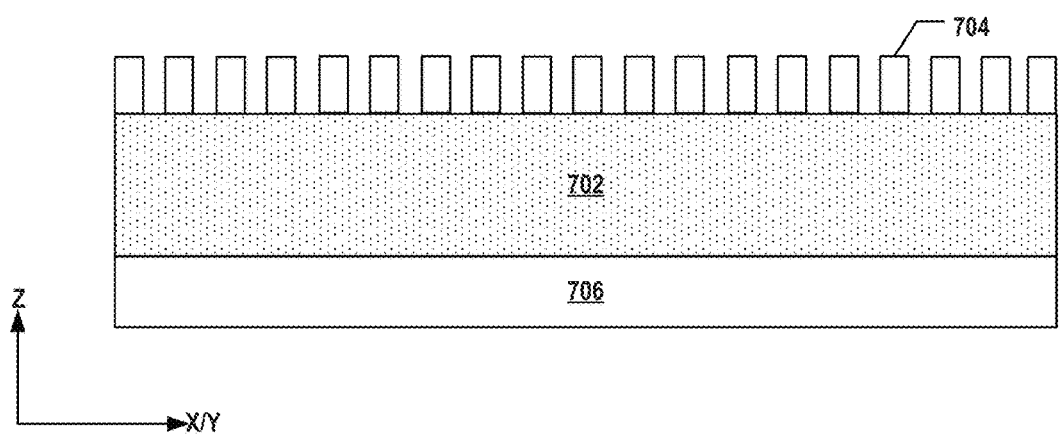
Figure 7C:
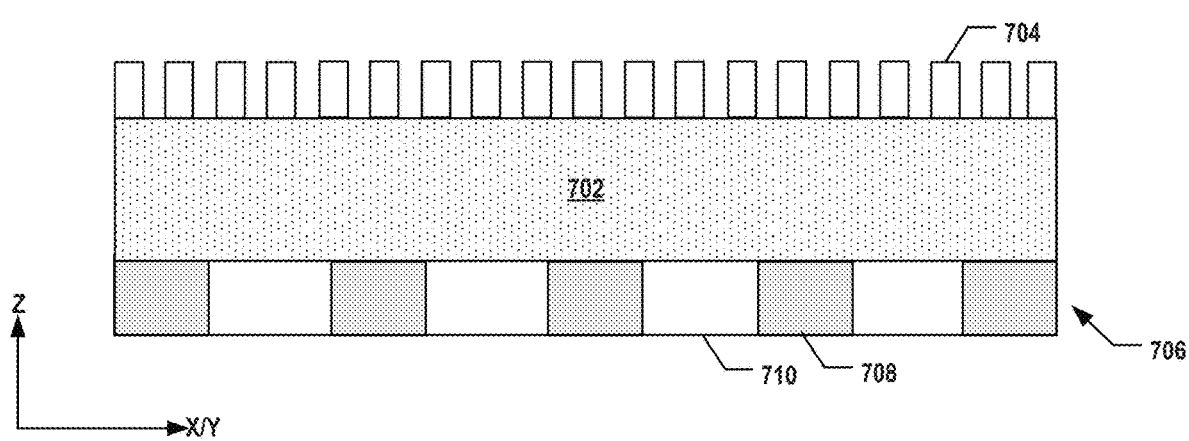
Figure 8:
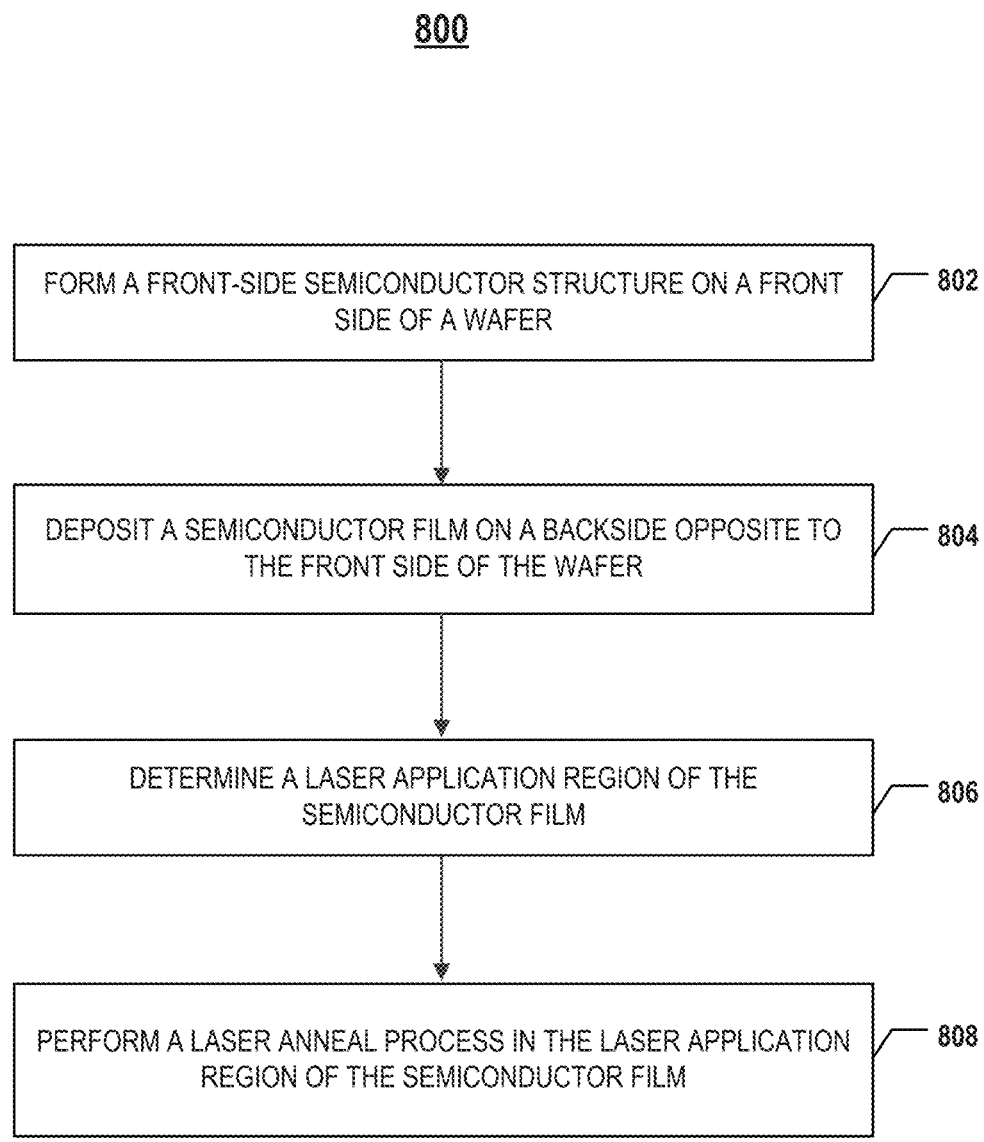
FIG. 8 is a flowchart of an exemplary method for forming an exemplary semiconductor structure, according to some aspects of the present disclosure.

FIGS. 7A-7C illustrate an exemplary fabrication process for forming a semiconductor structure, according to some aspects of the present disclosure. FIG. 8 is a flowchart of an exemplary method 800 for forming an exemplary semiconductor structure, according to some aspects of the present disclosure. FIGS. 7A-7C and 8 will be described together. It is understood that the operations shown in method 800 are not exhaustive and that other operations can be performed as well before, after, or between any of the illustrated operations. Further, some of the operations may be performed simultaneously, or in a different order than shown in FIGS. 7A-7C and 8.

Referring to FIG. 8, method 800 starts at operation 802, in which a front-side semiconductor structure is formed on a front side of a wafer. As illustrated in FIG. 7A, a front-side semiconductor structure 704 is formed on a front side of a wafer 702. Front-side semiconductor structure 704 can be parts of any suitable semiconductor devices arranged in multiple dies of wafer 702. Examples of front-side semiconductor structure 704 may include various semiconductor structures in the 3D memory devices disclosed herein. The formation of front-side semiconductor structure 704 on the front side of wafer 702 can introduce unbalanced stress distribution in different directions in the wafer plane, which can cause different shape variations in the different directions of wafer 702.

Method 800 proceeds to operation 804, as illustrated in FIG. 8, in which a semiconductor film is deposited on a backside opposite to the front side of the wafer. In some implementations, the semiconductor film is deposited after mismatched stress is incurred on the wafer, so that the mismatched stress can be controlled more effectively to improve the flatness of the wafer when compared to depositing the semiconductor film before the occurrence of the mismatched stress. As illustrated in FIG. 7B, a semiconductor film 706 is deposited on the backside of wafer 702. The material of semiconductor film 706 can include, for example, amorphous silicon. Semiconductor film 706 can be formed by one or more thin film deposition processes including, but not limited to, chemical vapor deposition (CVD), physical vapor deposition (PVD), atomic layer deposition (ALD), electrochemical depositions, or any combination thereof. In some implementations, semiconductor film 706 may include a composite film having multiple sub-films having the same material stacked one above another.

Method 800 proceeds to operation 806, as illustrated in FIG. 8, in which a laser application region of the semiconductor film is determined. For example, operations like those described above with reference to FIG. 3 may be performed to determine a laser application region of the semiconductor film.

Method 800 proceeds to operation 808, as illustrated in FIG. 8, in which a laser anneal process is performed in the laser application region of the semiconductor film. As illustrated in FIG. 7B, a laser application region of semiconductor film 706 may include portions 708 of semiconductor film 706. A laser anneal process may be performed on portions 708 of semiconductor film 706 based on one or more laser control parameters to transform amorphous silicon in portions 708 into polysilicon. The material of remaining portions 710 of semiconductor film 706 can include amorphous silicon.

It is contemplated that some of the operations illustrated in FIG. 7A-7C or 8 may be performed in different orders. For example, operation 804 in which the semiconductor film is deposited on the backside of the wafer can be performed prior to operation 806 in which the laser application region is determined. Alternatively, operation 806 in which the laser application region is determined can be performed prior to operation 804 in which the semiconductor film is deposited on the backside of the wafer.

Thus, the semiconductor structure formed by the fabrication process of FIGS. 7A-7C or method 800 of FIG. 8 may include wafer 702, front-side semiconductor structure 704 formed on the front side of wafer 702, and semiconductor film 706 covering the backside of wafer 702. Semiconductor film 706 may include at least one of amorphous silicon or polysilicon. For example, semiconductor film 706 may include amorphous silicon, polysilicon, or a combination of amorphous silicon and polysilicon. The polysilicon may be in the laser application region of semiconductor film 706.

In some implementations, the laser application region may include a plurality of application zones each extending along a first direction. The amorphous silicon may be in space among the plurality of application zones.

In some implementations, at least part of the semiconductor film may be removed from the backside of the wafer. In some implementations, part or the entirety of the semiconductor film may be removed either by the subsequent fabrication processes, e.g., wafer thinning or dicing, or to allow the subsequent fabrication processes to be performed (e.g., fabrication processes that require backside vacuum suction to hold the wafer). The timing of removing the semiconductor film can be determined based on the current fabrication process and/or subsequent fabrication processes. In some implementations, the removal of the semiconductor film does not affect the backside stress control after certain fabrication stages, for example, when openings of semiconductor structures have been filled with filling materials during the fabrication stage. It is understood that in some implementations, part or the entirety of the semiconductor film may remain intact even after the final fabrication process.

In some implementations, the semiconductor structure formed by the fabrication process of FIGS. 7A-7C or method 800 of FIG. 8 may be split into a plurality of dies. Each die may include a semiconductor substrate having a front side and a backside opposite to the front side. The material of the semiconductor substrate may include monocrystalline silicon. The semiconductor substrate may be part of the wafer. The die may include one or more semiconductor devices on the front side of the semiconductor substrate. Each semiconductor device may include a 3D memory device. The die may further include a semiconductor film covering the backside of the semiconductor substrate and including at least one of amorphous silicon or polysilicon. Polysilicon may be in a region of the semiconductor film. The semiconductor film of the die may be part of the semiconductor film of the semiconductor structure formed by the fabrication process of FIGS. 7A-7C or method 800 of FIG. 8.

According to one aspect of the present disclosure, a method for controlling wafer stress is disclosed. A semiconductor film is formed on a backside of a wafer. The wafer is deformed by stress associated with a front-side semiconductor structure on a front side of the wafer opposite to the backside of the wafer. A laser application region of the semiconductor film is determined. A laser anneal process is performed in the laser application region of the semiconductor film.

In some implementations, a shape variation of the wafer incurred by the stress associated with the front-side semiconductor structure is determined.

In some implementations, the laser application region of the semiconductor film is determined based on the shape variation of the wafer.

In some implementations, empirical laser application data is obtained. The laser application region of the semiconductor film is determined based on the empirical laser application data.

In some implementations, the empirical laser application data is obtained based on at least one of a design of the front-side semiconductor structure or a fabrication stage of the front-side semiconductor structure.

In some implementations, the laser application region includes at least a portion of the semiconductor film.

In some implementations, the laser application region includes a plurality of application zones in the semiconductor film, and the plurality of application zones extend along a first direction, respectively.

In some implementations, the laser application region includes a region of the semiconductor film that corresponds to a region of the wafer having a mismatched local stress distribution.

In some implementations, one or more laser control parameters for the laser application region are determined. The laser anneal process is performed in the laser application region based on the one or more laser control parameters.

In some implementations, the one or more laser control parameters include at least one of a laser power or a laser application time.

In some implementations, the semiconductor film includes amorphous silicon.

In some implementations, the amorphous silicon in the laser application region of the semiconductor film is transformed into polysilicon by the laser anneal process.

According to another aspect of the present disclosure, a method for forming a semiconductor structure is disclosed. A front-side semiconductor structure is formed on a front side of a wafer. A semiconductor film is deposited on a backside opposite to the front side of the wafer. A laser application region of the semiconductor film is determined. A laser anneal process is performed in the laser application region of the semiconductor film.

In some implementations, a shape variation of the wafer incurred by stress associated with a fabrication stage of the front-side semiconductor structure is determined.

In some implementations, the laser application region of the semiconductor film is determined based on the shape variation of the wafer.

In some implementations, empirical laser application data is obtained. The laser application region of the semiconductor film is determined based on the empirical laser application data.

In some implementations, the empirical laser application data is obtained based on at least one of a design of the front-side semiconductor structure or a fabrication stage of the front-side semiconductor structure.

In some implementations, the laser application region includes at least a portion of the semiconductor film.

In some implementations, the laser application region includes a plurality of application zones in the semiconductor film, and the plurality of application zones extend along a first direction, respectively.

In some implementations, the laser application region includes a region of the semiconductor film that corresponds to a region of the wafer having a mismatched local stress distribution.

In some implementations, one or more laser control parameters are determined for the laser application region. The laser anneal process is performed in the laser application region based on the one or more laser control parameters.

In some implementations, the one or more laser control parameters include at least one of a laser power or a laser application time.

In some implementations, the semiconductor film includes amorphous silicon.

In some implementations, the amorphous silicon in the laser application region of the semiconductor film is transformed into polysilicon by the laser anneal process.

According to still another aspect of the present disclosure, a semiconductor structure includes a wafer, a front-side semiconductor structure, and a semiconductor film. The wafer has a front side and a backside opposite to the front side. The front-side semiconductor structure is formed on the front side of the wafer. The semiconductor film covers the backside of the wafer and includes at least one of amorphous silicon or polysilicon.

In some implementations, the polysilicon is in a laser application region of the semiconductor film.

In some implementations, the laser application region includes a plurality of application zones each extending along a first direction.

In some implementations, the amorphous silicon is in space among the plurality of application zones.

In some implementations, the front-side semiconductor structure includes a plurality of 3D memory devices.

According to yet another aspect of the present disclosure, a semiconductor structure includes a semiconductor substrate, a semiconductor device, and a semiconductor film. The semiconductor substrate has a front side and a backside opposite to the front side. The semiconductor device is on the front side of the semiconductor substrate. The semiconductor film covers the backside of the semiconductor substrate and includes at least one of amorphous silicon or polysilicon.

In some implementations, the polysilicon is in a region of the semiconductor film.

In some implementations, the semiconductor device includes a 3D memory device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for controlling wafer stress, comprising:
   forming a semiconductor film on a backside of a wafer after forming a front-side semiconductor structure, wherein the wafer is deformed due to stress associated with the front-side semiconductor structure on a front side of the wafer opposite to the backside of the wafer;
   determining a laser application region of the semiconductor film; and
   performing a laser anneal process in the laser application region of the semiconductor film.

2. The method of claim 1, further comprising:
   determining a shape variation of the wafer incurred by the stress associated with the front-side semiconductor structure.

3. The method of claim 2, wherein determining the laser application region of the semiconductor film comprises:
   determining the laser application region of the semiconductor film based on the shape variation of the wafer.

4. The method of claim 1, wherein determining the laser application region of the semiconductor film comprises:
   obtaining empirical laser application data; and
   determining the laser application region of the semiconductor film based on the empirical laser application data.

5. The method of claim 4, wherein obtaining the empirical laser application data comprises:
   obtaining the empirical laser application data based on at least one of a design of the front-side semiconductor structure or a fabrication stage of the front-side semiconductor structure.

6. The method of claim 1, wherein the laser application region comprises at least a portion of the semiconductor film.

7. The method of claim 6, wherein the laser application region comprises a plurality of application zones in the semiconductor film, and the plurality of application zones extend along a first direction, respectively.

8. The method of claim 6, wherein the laser application region comprises a region of the semiconductor film that corresponds to a region of the wafer having a mismatched local stress distribution.

9. The method of claim 1, wherein performing the laser anneal process in the laser application region of the semiconductor film comprises:
   determining one or more laser control parameters for the laser application region; and
   performing the laser anneal process in the laser application region based on the one or more laser control parameters.

10. The method of claim 9, wherein the one or more laser control parameters comprise at least one of a laser power or a laser application time.

11. The method of claim 1, wherein the semiconductor film comprises amorphous silicon.

12. The method of claim 11, wherein the amorphous silicon in the laser application region of the semiconductor film is transformed into polysilicon by the laser anneal process.

13. A method for forming a semiconductor structure, comprising:
    forming a front-side semiconductor structure on a front side of a wafer;
    after forming the front-side semiconductor structure, depositing a semiconductor film on a backside opposite to the front side of the wafer;
    determining a laser application region of the semiconductor film based on deformation of the wafer due to stress associated with formation of the front-side semiconductor structure; and
    performing a laser anneal process in the laser application region of the semiconductor film.

14. The method of claim 13, further comprising determining a shape variation of the wafer incurred by stress associated with a fabrication stage of the front-side semiconductor structure.

15. The method of claim 14, wherein determining the laser application region of the semiconductor film comprises:
    determining the laser application region of the semiconductor film based on the shape variation of the wafer.

16. The method of claim 1, wherein:
    the laser application region comprises a portion of the semiconductor film.

17. The method of claim 16, wherein:
    after the laser anneal process, the semiconductor film comprises polysilicon in the laser application region and amorphous silicon in a non-laser application region.

18. The method of claim 1, wherein:
    the semiconductor film is formed on the backside of the deformed wafer having the front-side semiconductor structure on the front side of the deformed wafer; and
    the method further comprises determining a shape variation of the deformed wafer.

19. The method of claim 1, wherein:
    the semiconductor film is formed on the backside of the deformed wafer having semiconductor structure on the front side of the deformed wafer; and
    determining the laser application region comprises determining the laser application region of the semiconductor film based on the deformed wafer.

20. A method for controlling wafer stress, comprising:
    forming a semiconductor film on a backside of a wafer, wherein the wafer is deformed due to stress associated with a front-side semiconductor structure on a front side of the wafer opposite to the backside of the wafer;
    determining at least a portion of the semiconductor film as a laser application region, wherein the laser application region comprises one of:
      a plurality of application zones, respectively extending along a first direction, in the semiconductor film; or a region of the semiconductor film corresponding to a
region of the wafer having a mismatched local stress
distribution; and
performing a laser anneal process in the laser application
region of the semiconductor film.

\* \* \* \* \*